United States Patent
Kim et al.

(10) Patent No.: US 10,340,404 B2
(45) Date of Patent: Jul. 2, 2019

(54) MULTILAYER FILM AND PHOTOVOLTAIC MODULE

(71) Applicant: LG CHEM LTD., Seoul (KR)

(72) Inventors: Hyun Cheol Kim, Daejeon (KR); Je Sik Jung, Daejeon (KR); Do Won Ahn, Daejeon (KR)

(73) Assignee: LG Chem, Ltd., Seoul (KR)

( * ) Notice: Subject to any disclaimer, the term of this patent is extended or adjusted under 35 U.S.C. 154(b) by 61 days.

(21) Appl. No.: 14/075,729

(22) Filed: Nov. 8, 2013

(65) Prior Publication Data

US 2014/0137926 A1 May 22, 2014

Related U.S. Application Data

(63) Continuation of application No. PCT/KR2013/004915, filed on Jun. 4, 2013.

(30) Foreign Application Priority Data

Jun. 4, 2012 (KR) .......................... 1020120059971
Jun. 4, 2012 (KR) .......................... 1020120059972

(51) Int. Cl.
*H01L 31/049* (2014.01)
*H02S 40/22* (2014.01)
(Continued)

(52) U.S. Cl.
CPC ............ *H01L 31/049* (2014.12); *B32B 15/08* (2013.01); *B32B 15/18* (2013.01); *B32B 15/20* (2013.01);
(Continued)

(58) Field of Classification Search
CPC ..... H01L 33/50; H01L 33/501; H01L 33/502; H01L 31/048; H01L 31/02167;
(Continued)

(56) References Cited

U.S. PATENT DOCUMENTS 6,465,726 B2 * 10/2002 Yamada et al. ................ 136/251
6,680,357 B1 * 1/2004 Hedhli .................. C08F 259/08
524/458
(Continued)

FOREIGN PATENT DOCUMENTS

CN 102361755 A 2/2012
CN 102470653 A 5/2012
(Continued)

OTHER PUBLICATIONS

Machine Translation of JP 2008030459. Accessed online on Oct. 23, 2017.*
(Continued)

*Primary Examiner* — Liesl C Baumann
(74) *Attorney, Agent, or Firm* — Dentons US LLP

(57) ABSTRACT

Provided is a multilayer film including inorganic particles having a band gap energy of 3.3 eV or more and inorganic particles having a band gap energy of less than 3.3 eV in different layers. Here, the layer including inorganic particles having band gap energy of 3.3 eV or more is disposed at an upper portion than the layer including inorganic particles having a band gap energy of less than 3.3 eV. Accordingly, the layer including inorganic particles having a band gap energy of 3.3 eV or more is included close to incident light to increase a reflectance in UV region and induce internal reflection, thereby enhancing energy conversion efficiency of a cell. At the same time, the multilayer film may include a lower encapsulant layer or backsheet including inorganic particles having a band gap energy of 3.3 eV or more, thereby increasing reflectances in visible and IR regions and thus reducing a loss of the incident light.

8 Claims, 7 Drawing Sheets

(51) Int. Cl.
- *B32B 27/36* (2006.01)
- *B32B 27/08* (2006.01)
- *B32B 15/20* (2006.01)
- *B32B 15/18* (2006.01)
- *B32B 15/08* (2006.01)

(52) U.S. Cl.
CPC ............. *B32B 27/08* (2013.01); *B32B 27/36* (2013.01); *H02S 40/22* (2014.12); *B32B 2255/10* (2013.01); *B32B 2255/20* (2013.01); *B32B 2255/28* (2013.01); *B32B 2307/412* (2013.01); *B32B 2307/418* (2013.01); *B32B 2307/712* (2013.01); *B32B 2457/12* (2013.01); *Y02E 10/52* (2013.01); *Y10T 428/24942* (2015.01)

(58) Field of Classification Search
CPC ............. H01L 31/0487; H01L 31/0522; H01L 31/0527; H01L 31/049; H01L 31/0481; H01L 31/18; Y02E 10/50; Y02E 10/52; B32B 27/08; B32B 27/36; B32B 15/20; B32B 15/18; B32B 2457/12; B32B 2307/418; B32B 2307/412; B32B 2255/28; B32B 2255/20; B32B 2255/10; B32B 2307/712; H02S 40/22; Y10T 428/24942
USPC ................ 136/244, 246, 251, 252, 256, 259
See application file for complete search history.

(56) References Cited

U.S. PATENT DOCUMENTS

| | | | | |
|---|---|---|---|---|
| 2003/0123909 | A1* | 7/2003 | Akashi | G03G 15/0928 399/286 |
| 2011/0114148 | A1* | 5/2011 | Temchenko | B32B 15/08 136/244 |
| 2011/0277834 | A1* | 11/2011 | Hatakeyama et al. | 136/256 |
| 2012/0031475 | A1* | 2/2012 | Kim | C09D 127/16 136/252 |
| 2012/0063952 | A1* | 3/2012 | Hong | B32B 27/18 422/24 |
| 2012/0167976 | A1* | 7/2012 | Aoyama et al. | 136/256 |
| 2012/0192944 | A1* | 8/2012 | Aoyama | B32B 27/18 136/256 |
| 2012/0202083 | A1* | 8/2012 | Shiomi | B29C 55/12 428/480 |
| 2013/0171447 | A1* | 7/2013 | Kim | H01L 31/0481 428/336 |

FOREIGN PATENT DOCUMENTS

| | | | |
|---|---|---|---|
| EP | 2439788 A2 | 4/2012 | |
| EP | 2476552 A1 | 7/2012 | |
| GB | 2065139 B | 6/1981 | |
| JP | 56-101849 A | 8/1981 | |
| JP | 59-41249 A | 3/1984 | |
| JP | 11-170462 A | 6/1999 | |
| JP | 3965750 B2 | 6/2007 | |
| JP | 2008-30459 A | 2/2008 | |
| JP | 2008030459 A * | 2/2008 | |
| JP | 4178570 B2 | 9/2008 | |
| JP | 2009212432 A | 9/2009 | |
| JP | WO 2011030745 A1 * | 3/2011 | ............ B32B 27/18 |
| JP | 2011173241 A | 9/2011 | |
| JP | 2013-52635 A | 3/2013 | |
| KR | 1020110039697 A | 4/2011 | |
| KR | 20110063918 A * | 6/2011 | |
| KR | 1020120034131 A | 4/2012 | |
| TW | 201127631 A1 | 8/2011 | |
| WO | WO-2011139052 A2 * | 11/2011 | ......... H01L 31/0481 |

OTHER PUBLICATIONS

Human Partial Translation of JP 2008-030459, translated on Jun. 18, 2018, JP publication year 2008. (Year: 2008).*

* cited by examiner

[FIG. 1]
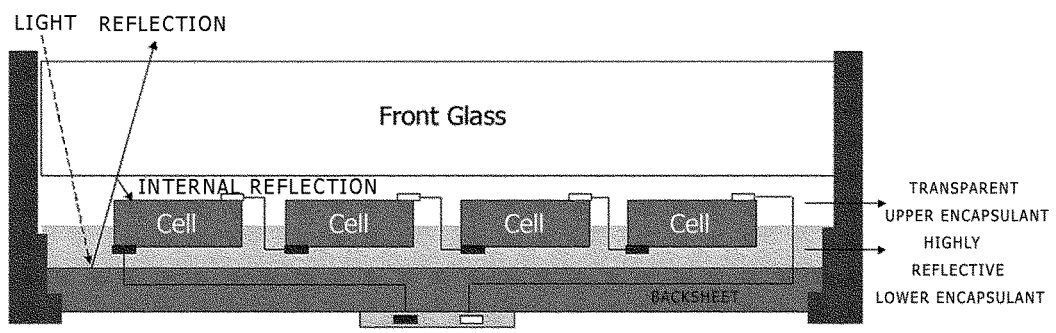
[FIG. 2]
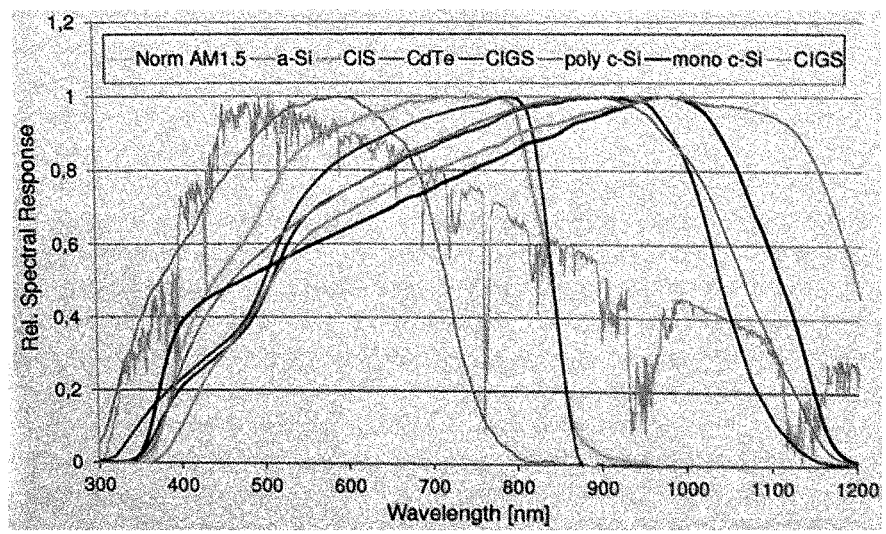

[FIG. 3]
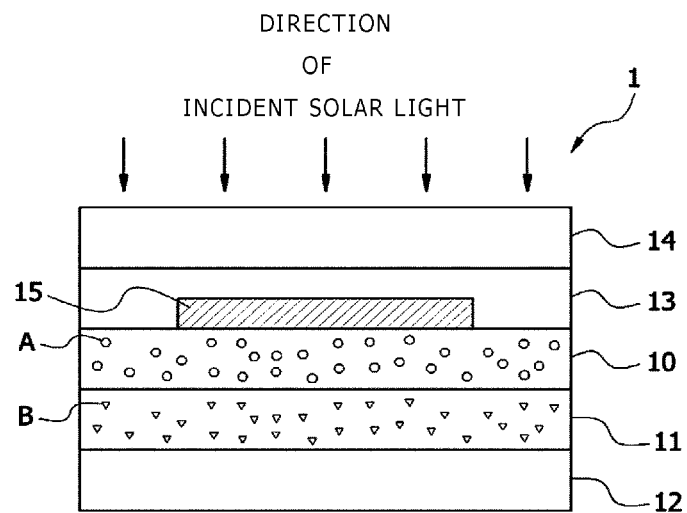
[FIG. 4]
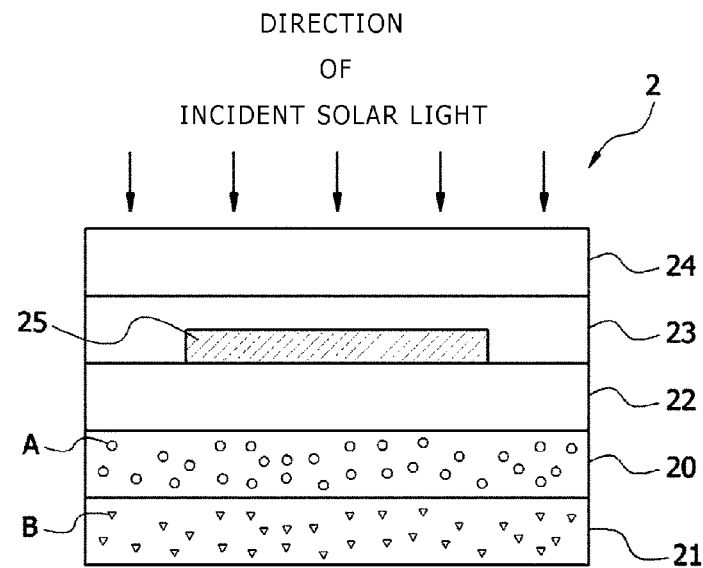

[FIG. 5]
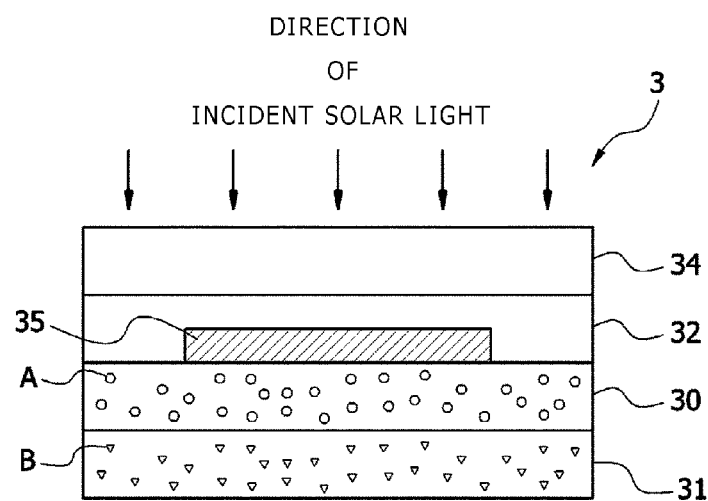

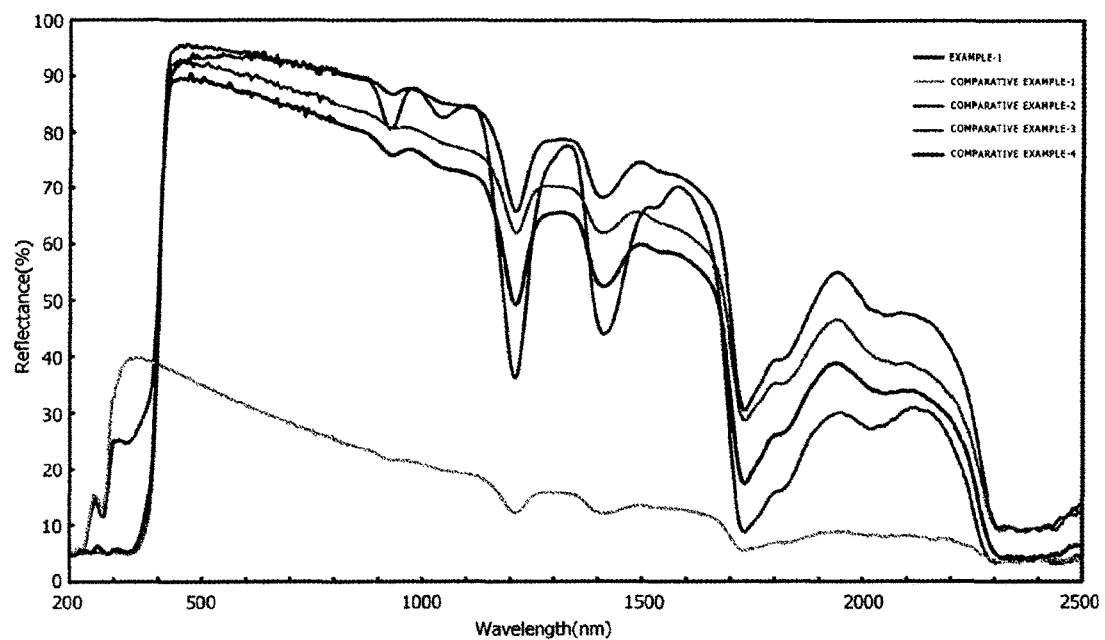
[FIG. 6a]

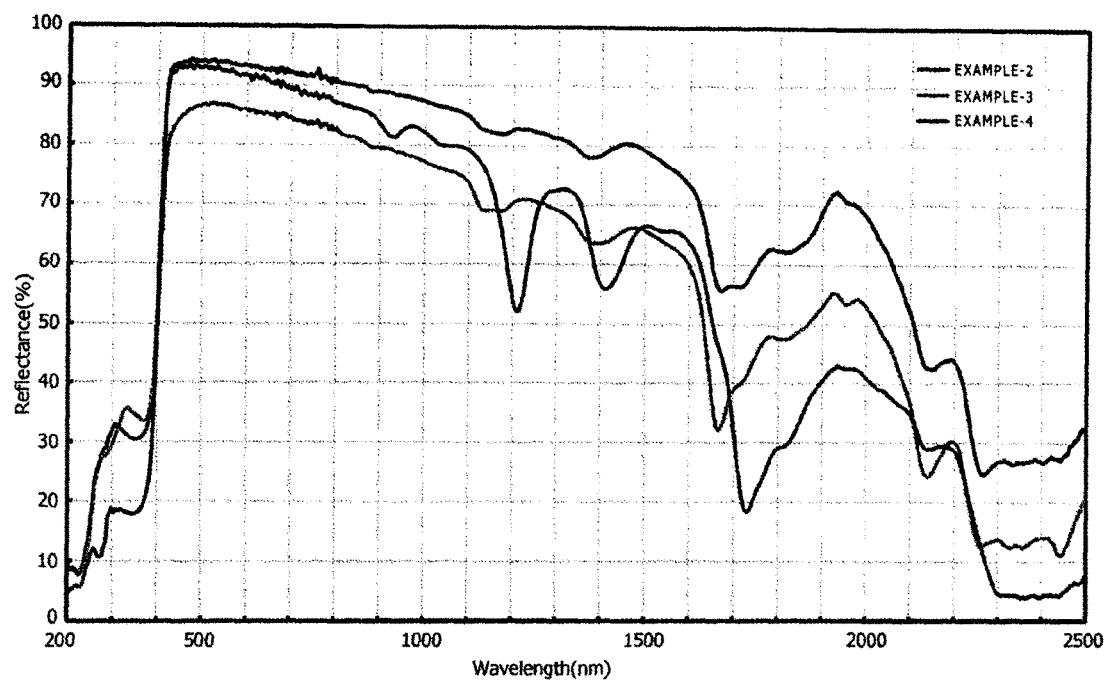
[FIG.6b]

[FIG. 7a]
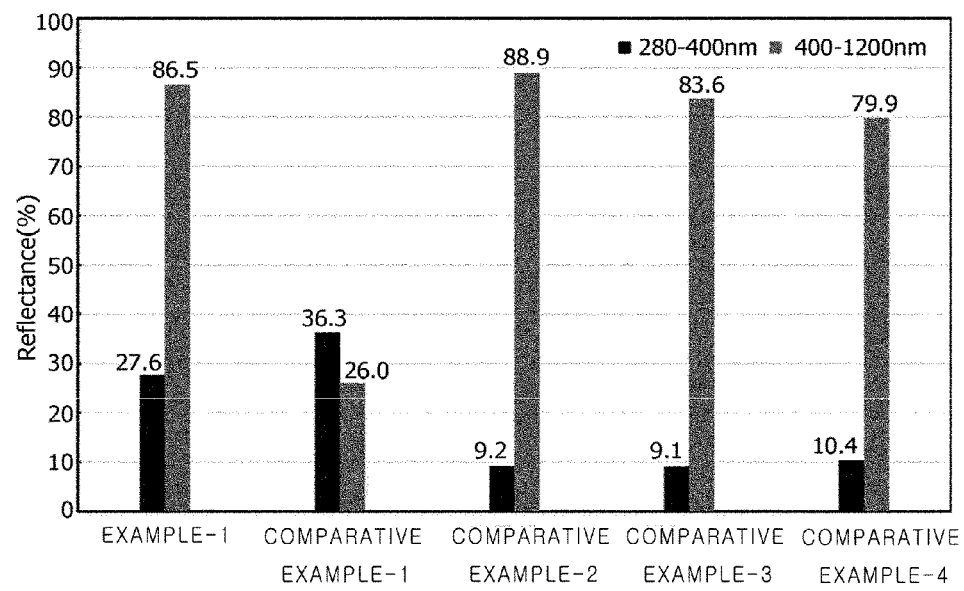

[FIG. 7b]
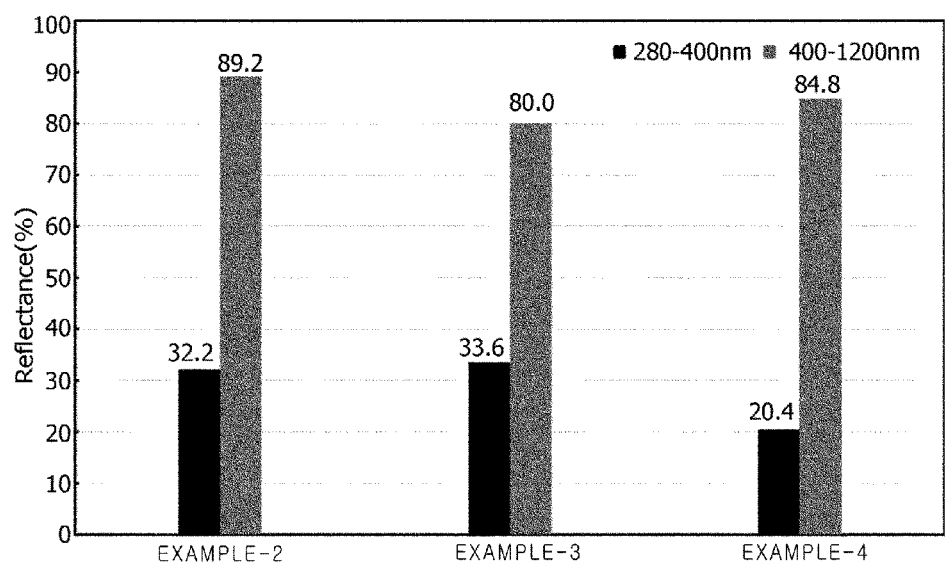

MULTILAYER FILM AND PHOTOVOLTAIC MODULE

This application is a Continuation Bypass Application of International Patent Application No. PCT/KR2013/004915, filed Jun. 2013, and claims the benefit of Korean Patent Application No. 10-2012-0059971 filed on Jun. 4, 2012, and Korean Patent Application No. 10-2012-0059972 filed on Jun. 4, 2012, in the Korean Intellectual Property Office, the disclosures of which are incorporated herein by reference.

BACKGROUND

1. Field of the Invention

The present application relates to a multilayer film having excellent reflectances with respect to all of UV, visible, and IR regions and a photovoltaic module capable of expecting enhancement in total energy conversion efficiency.

2. Discussion of Related Art

Recently, there are growing concerns on renewable and clean energy because of global environment problems and exhaustion of fossil fuels, and among these, solar energy has attracted attention as a representative pollution-free energy source which can resolve problems of environmental pollution and exhaustion of the fossil fuels.

A photovoltaic cell to which a principle of generating solar power is applied is a device for converting solar light into electric energy. Since the photovoltaic cell is necessarily exposed to an external environment for a long time to facilitate absorption of the solar light, the photovoltaic cell is formed in a unit type by performing various packaging processes to protect the cell. The unit is referred to as a photovoltaic module.

However, a photovoltaic cell has relatively low energy conversion efficiency. Solar light has a wide wavelength region including UV, visible, and IR regions, but the wavelength region used in the photovoltaic cell is limited and an absorption rate into the photovoltaic cell is low even if the light in a wide wavelength range is incident to the photovoltaic module.

Accordingly, a photovoltaic module capable of expecting enhancement in total energy conversion efficiency by making the most of the incident light is needed.

SUMMARY OF THE INVENTION

The present application is directed to providing a multilayer film having excellent reflectances with respect to all of the UV, visible, and IR regions by enhancing the reflectance with respect to the UV region.

The present application is also directed to providing a photovoltaic module having excellent energy conversion efficiency with respect to all of the UV, visible, and IR regions by enhancing reflectance of an encapsulant or backsheet disposed below a photovoltaic cell with respect to a UV region.

One aspect of the present application may provide a multilayer film including inorganic particles having a band gap energy of 3.3 eV or more and inorganic particles having band gap energy of less than 3.3 eV in different layers, and the layer including inorganic particles having a band gap energy of 3.3 eV or more is disposed at an upper portion than the layer including inorganic particles having a band gap energy of less than 3.3 eV.

In one embodiment of the present application, the multilayer film may be an encapsulant encapsulating a photovoltaic module or a backsheet for the photovoltaic module, or a product in which an encapsulant and a backsheet are integrated.

Another aspect of the present application may provide a photovoltaic module including a multilayer encapsulant and/or a backsheet, each of which includes the multilayer film.

BRIEF DESCRIPTION OF THE DRAWINGS

FIG. 1 is a schematic diagram showing reflection of incident light of a photovoltaic module;

FIG. 2 is a solar absorption spectrum of a commercially available photovoltaic cell;

FIGS. 3 to 5 are cross-sectional views of a photovoltaic module according to exemplary embodiments of the present application;

FIGS. 6A and 6B are reflectance spectra according to wavelengths with respect to samples prepared in Examples and Comparative Examples; and FIGS. 7A and 7B are graphs of reflectance of the samples prepared in Examples and Comparative Examples.

DETAILED DESCRIPTION OF EXEMPLARY EMBODIMENTS

Hereinafter, embodiments of the present application will be described in further detail with reference to the accompanying drawings. Conventional or general-purpose functions or configurations may be omitted from the description and the accompanying drawings for the sake of clarity and concision. Thicknesses, sizes, proportions, and shapes of layers and regions shown in the drawings may be exaggerated to provide clear illustration and therefore have no bearing on the scope of the present application.

A multilayer film according to one exemplary embodiment of the present application includes at least two layers, and inorganic particles having a band gap energy of 3.3 eV or more and inorganic particles having a band gap energy of less than 3.3 eV in different layers. Particularly, the layer including inorganic particles having band gap energy of 3.3 eV or more is disposed at an upper portion than the layer including inorganic particles having a band gap energy of less than 3.3 eV. In one example, the multilayer film may include barium sulfate ($BaSO_4$) and titanium dioxide ($TiO_2$) in different layers, and the layer including barium sulfate ($BaSO_4$) is disposed at a high level than the layer including titanium dioxide ($TiO_2$).

In the multilayer film, the "upper" means that the layer is disposed in an upper portion, based on incident light, that is, close to the incident light. Accordingly, in the multilayer film, the layer including inorganic particles having band gap energy of 3.3 eV or more is disposed closer to incident light than the layer including inorganic particles having a band gap energy of less than 3.3 eV. The reflectance of the layer including inorganic particles having band gap energy of 3.3 eV or more is higher than that of the layer including inorganic particles having a band gap energy of less than 3.3 eV with respect to UV rays, which is because the inorganic particles having band gap energy of 3.3 eV or more has a higher UV reflectance than the inorganic particles having band gap energy of less than 3.3 eV. Unlike the inorganic particles having a band gap energy of 3.3 eV or more, the inorganic particles having band gap energy of less than 3.3 eV absorbs UV rays, and thus have a low reflectance with respect to the UV rays.

Transmission or absorption of the incident light relates to an original property such as band gap energy of each material. When light having a higher energy than band gap energy of an arbitrary material is incident, the light is absorbed, and light having lower energy than the band gap energy is transmitted. Such band gap energy is inversely proportional to a wavelength range. While light having a long wavelength and a lower energy than the band gap energy penetrates a material having low band gap energy, light having a short wavelength and a higher energy than the band gap energy is absorbed, and also penetrates a material having higher band gap energy.

Likewise, a wavelength range of penetrating light is determined by the original band gap energy of an arbitrary material, and the penetrating light is refracted due to a difference in refractive index from an external environment through a particle. When inorganic particles have an almost spherical shape, such refraction is more accelerated. The light penetrating a specific particle due to such refraction is reflected in the particle, which is more easily observed when inorganic particles each having a high refractive index are dispersed in a resin having a low refractive index.

Accordingly, when such inorganic particles having band gap energy of less than 3.3 eV are also included in the layer including inorganic particles having a band gap energy of 3.3 eV or more, a reflectance of the multilayer film with respect to UV rays is decreased. In addition, even when the layer including inorganic particles having a band gap energy of less than 3.3 eV is disposed at an upper portion than the layer including inorganic particles having band gap energy of 3.3 eV or more, it absorbs only UV rays, which is light having a wavelength of 375 nm or less corresponding to a band gap energy of 3.3 eV, and thus the reflectance with respect to the UV rays is decreased.

Generally, when the photovoltaic cell is manufactured in a module type, the cell is protected using an encapsulant, which is usually transparent. Recently, as an upper encapsulant on the front part to which solar light is incident, a transparent encapsulant is used, and as a lower encapsulant on the backsheet, an encapsulant including inorganic particles such as titanium dioxide ($TiO_2$) has been introduced. Likewise, by separating the upper and lower encapsulants, when an encapsulant having a high reflectance is used as the lower encapsulant, as shown in FIG. 1, lights reflected by the lower encapsulant may be reflected again into the inside due to the front part (e.g., glass) of the cell to be incident again to the cell, thereby increasing power generating efficiency of the cell.

When the inorganic particles having a band gap energy of less than 3.3 eV such as titanium dioxide ($TiO_2$) is included, the layer has a high reflectance until an IR region from a visible region of 400 nm or more, but has a very low reflectance in a UV region of less than 400 nm. This is because light (UV rays) having a shorter wavelength than the wavelength (e.g., 410 nm) of the light corresponding to a band gap energy of titanium dioxide (rutile titanium dioxide) such as 3.02 eV is absorbed.

However, as shown in FIG. 2, various commercially available photovoltaic cells generate electricity using light in the UV region. FIG. 2 shows the change in solar absorption spectrum according to the kind of a photovoltaic cell. It can be seen that there is a difference in solar absorption spectrum according to the kind of a photovoltaic cell, and thus there is a difference in energy conversion efficiency.

According to exemplary embodiments of the present application, to enhance the energy conversion efficiency of the photovoltaic module, an encapsulant, a back sheet, or a product in which an encapsulant and a backsheet are integrated, which has a high reflectance to UV rays, is provided. As a multilayer film used in such an encapsulant, backsheet, or integrated product, a multilayer film further including a layer including inorganic particles having a band gap energy of 3.3 eV or more, which is disposed at an upper portion than a layer including inorganic particles having a band gap energy of less than 3.3 eV, is used to increase a reflectance. Due to the layer including inorganic particles having a band gap energy of 3.3 eV or more, light in the UV region is further used by increasing a reflectance in the UV region of light incident to a cell, thereby reducing a loss of the incident light, and thus the photovoltaic module capable of expecting enhancement of total energy conversion efficiency may be provided.

However, while the inorganic particles having a band gap energy of 3.3 eV or more such as barium sulfate ($BaSO_4$) has a high reflectance with respect to the light in the UV region, it has a low reflectance with respect to lights in visible and IR regions due to a low refractive index (1.65). For this reason, in exemplary embodiments of the present application, the reflectance with respect to solar light in every region may be increased and thus energy conversion efficiency may be increased by further including a lower encapsulant layer or a lower backsheet including inorganic particles having a band gap energy of less than 3.3 eV, which has a high refractive index (2.73) such as titanium dioxide ($TiO_2$).

In addition, to reflect the incident light to be incident again to the cell, the layer including inorganic particles having a band gap energy of 3.3 eV or more and the layer including inorganic particles having a band gap energy of less than 3.3 eV are disposed below the photovoltaic cell. The inorganic particles having band gap energy of 3.3 eV or more and the inorganic particles having band gap energy of less than 3.3 eV serve to reflect a specific wavelength range of the incident light, are not suitable for an upper encapsulant, but suitable for a lower encapsulant or backsheet. It is preferable that a transparent encapsulant is used as the upper encapsulant to make most of solar lights indent.

As described above, the reflectance of the layer including inorganic particles having a band gap energy of 3.3 eV or more with respect to the UV rays is higher than that of the layer including inorganic particles having a band gap energy of less than 3.3 eV. Particularly, the reflectance of the layer including inorganic particles having a band gap energy of 3.3 eV or more with respect to the UV rays in a wavelength range from 280 to 400 nm is 30 to 40%, but the reflectance of the layer including inorganic particles having a band gap energy of less than 3.3 eV is merely 5 to 10%. This is because the inorganic particles having a band gap energy of 3.3 eV or more has a higher reflectance with respect to a UV region than the inorganic particles having a band gap energy of less than 3.3 eV.

However, reflectances of the layer including inorganic particles having a band gap energy of less than 3.3 eV with respect to visible rays in a wavelength range from 400 to 1200 nm and IR rays having a wavelength of 1200 nm or more are higher than that of the layer including inorganic particles having a band gap energy of 3.3 eV or more.

Accordingly, the energy conversion efficiency is increased by increasing the reflectance in every region by including all of the both layers described above.

The multilayer film according to the exemplary embodiments of the present application has a reflectance of 10% or more with respect to UV rays in a wavelength range from 280 to 400 nm, and a reflectance of 60% or more with respect to visible rays in a wavelength range from 400 to 1200 nm.

As an example of the inorganic particles having band gap energy of 3.3 eV or more, at least one selected from the group consisting of barium sulfate ($BaSO_4$, 5 eV), aluminum nitride (AlN, 6.28 eV), boron nitride (BN, 5.5/5.96/6.36 eV), boron arsenide ($B_{12}As_2$, 3.47 eV), gallium nitride (GaN, 3.46 eV), zinc sulfide (3.54/3.91 eV), zinc oxide (3.37 eV), and tin oxide (3.7 eV) may be used. For example, the boron nitride has various crystal structures such as nanotube, hexagonal, and regular hexahedronal shapes, and thus has variations in band gap energy.

The inorganic particles having a band gap energy of less than 3.3 eV may be at least one selected from the group consisting of titanium dioxide ($TiO_2$, 3.02/2.73 eV), aluminum arsenide (AlAs, 2.16 eV), gallium arsenide (GaAs, 1.43 eV), gallium sulfide (GaS, 2.5 eV), tin sulfide (SnS, 1.1 eV), lead sulfide (PbS, 0.37 eV), silicon carbide (SiC, 2.86 eV), and barium titanate ($BaTiO_3$, 3.2 eV).

The inorganic particles having band gap energy of 3.3 eV or more and the inorganic particles having a band gap energy of less than 3.3 eV may be spherical. As the particles become more spherical, refraction of transmitted light is more frequently observed, and thus the spherical particles are preferable to reflect light.

The multilayer film may further include at least one transparent layer as needed. The at least one transparent layer may be disposed above the layer including inorganic particles having a band gap energy of 3.3 eV or more, between the inorganic particles having a band gap energy of 3.3 eV or more and the inorganic particles having a band gap energy of less than 3.3 eV, or below the layer including inorganic particles having a band gap energy of less than 3.3 eV. Such a transparent layer preferably has a high transmittance with respect to the incident light.

In a yet another embodiment, the layer including inorganic particles having a band gap energy of 3.3 eV or more may be directly stacked on the layer including inorganic particles having a band gap energy of less than 3.3 eV without a separate layer.

The layer including inorganic particles having a band gap energy of 3.3 eV or more includes a matrix resin, and the inorganic particles having a band gap energy of 3.3 eV or more in an amount of 10 to 200 parts by weight based on 100 parts by weight of the matrix resin. In the above range, the layer has a high reflectance with respect to the UV region, and also has high reflectances in visible and IR regions.

In addition, the layer including inorganic particles having a band gap energy of less than 3.3 eV also includes a matrix resin, and inorganic particles having a band gap energy of less than 3.3 eV in an amount of 10 to 200 parts by weight based on 100 parts by weight of the matrix resin. In the above range, the layer may have high reflectances with respect to visible and IR rays, and effectively increase a reflectance with a small amount due to a high refractive index.

The matrix resins included in the layer including inorganic particles having a band gap energy of 3.3 eV or more and the layer including inorganic particles having a band gap energy of less than 3.3 eV may be the same as or different from each other. The matrix resin may be a thermoplastic resin, a heat-curable resin, or a mixture thereof.

The matrix resin may be a polyolefin resin such as polyethylene or polypropylene; an acryl resin; a fluorine-based resin such as a polyvinylfluoride, polyvinylidene fluoride, or ethylene.tetrafluoroethylene copolymer; a polyester resin such as polyethyleneterephthalate, polyethylenenaphthalate, or polybutyleneterephthalate; a polycarbonate resin; a polyamide resin; a polyarylate resin; a polyethersulfone resin; a polysulfone resin; a polyacrylonitrile resin; an aromatic vinyl-based resin such as a polystyrene resin or an ABS resin; a silane-modified olefin resin; a polyurethane resin; an epoxy resin; an ethylenevinylacetate resin; or a mixture thereof, which may be used alone or a combination of at least two thereof.

Among these, the polyolefin resin has excellent electric insulability, and is suitable as a matrix resin for an encapsulant due to transparency. In addition, the fluorine-based resin is excellent in weather resistance and suitable as a matrix resin for a backsheet, but the present application is not limited thereto.

In the multilayer film, the layer including inorganic particles having a band gap energy of 3.3 eV or more may have a thickness of 1 to 1000 μm, for example, 10 to 600 μm. Since the reflectance with respect to the UV region may be dependent on an amount of particles per unit area, at least 20 g of the inorganic particles having a band gap energy of 3.3 eV or more may be included per unit square meter, and when an amount of particles per volume is the same, as the layer has a larger thickness, an amount of particles are increased.

The layer including inorganic particles having a band gap energy of less than 3.3 eV may have a thickness of 1 to 1000 μm, for example, 10 to 600 μm. The thicknesses of the layer including inorganic particles having a band gap energy of 3.3 eV or more and the layer including inorganic particles having a band gap energy of less than 3.3 eV may be the same as or different from each other.

However, as needed, for example, when the multilayer film or a part of the multilayer film is used as a backsheet, it may have a thickness of 1 to 100 or 3 to 30 μm.

In the multilayer film, at least one of the layer including inorganic particles having a band gap energy of 3.3 eV or more and the layer including inorganic particles having a band gap energy of less than 3.3 eV may further include at least one selected from the group consisting of an antioxidant, a photo stabilizer, a thermal stabilizer, and a UV stabilizer.

The multilayer film may be an encapsulant encapsulating a photovoltaic module or a backsheet for a photovoltaic module, and may be a product in which an encapsulant is integrated with a backsheet. Even though the multilayer film is applied to any product, when the layer including inorganic particles having a band gap energy of 3.3 eV or more is disposed to a side of the cell close to incident light, the layer may have a high reflectance with respect to UV rays.

A method of manufacturing the multilayer film is not particularly limited, and the multilayer film may be manufactured by a method of laminating a sheet manufactured by a casting method or extruding method to a substrate using an adhesive, or a method of coating a coating solution prepared by dissolving components constituting each layer on the substrate.

The present application also relates to a photovoltaic module including the multilayer film as an encapsulant and/or backsheet for a photovoltaic cell.

FIGS. 3 to 5 are cross-sectional views of photovoltaic modules according to exemplary embodiments of the present application.

In one embodiment of the present application, an encapsulant of the photovoltaic module may have a multilayer structure including a layer including inorganic particles having a band gap energy of 3.3 eV or more and a layer including inorganic particles having a band gap energy of less than 3.3 eV. Referring to FIG. 3, an encapsulant of a photovoltaic module 1 includes an encapsulant layer 10 including inorganic particles A having a band gap energy of 3.3 eV or more and an encapsulant layer 11 including inorganic particles B having a band gap energy of less than 3.3 eV. That is, the encapsulant for a photovoltaic cell including the encapsulant layers as a lower encapsulant 10 and 11 includes the encapsulant layer 10 including inorganic particles A having band gap energy of 3.3 eV or more and the encapsulant layer 11 including inorganic particles B having band gap energy of less than 3.3 eV, which are sequentially formed from a side on which solar light is incident. The photovoltaic module 1 may include a transparent front substrate 14, an upper encapsulant 13, and a photovoltaic cell 15, which are sequentially stacked from a incident direction of solar light above the lower encapsulant 10 and 11, and a backsheet 12 below the lower encapsulant 10 and 11.

In another embodiment of the present application, a backsheet for a photovoltaic module may have a multilayer structure including a layer including inorganic particles having a band gap energy of 3.3 eV or more and a layer including inorganic particles having a band gap energy of less than 3.3 eV. Referring to FIG. 4, a backsheet of a photovoltaic module 2 includes a layer 20 including inorganic particles A having a band gap energy of 3.3 eV or more and a layer 21 including inorganic particles B having a band gap energy of less than 3.3 eV, and such a backsheet provides weather resistance to the photovoltaic module 2, and serves to protect the module from an external environment. That is, the backsheet includes a layer 20 including inorganic particles A having a band gap energy of 3.3 eV or more and a layer 21 including inorganic particles B having a band gap energy of less than 3.3 eV, which are sequentially formed from a side on which solar light is incident. The photovoltaic module 2 may include a transparent front substrate 24, an upper encapsulant 23, a photovoltaic cell 25, and a lower encapsulant 22, which are sequentially stacked from a direction of incident solar light above the backsheet including the layers 20 and 21.

In still another embodiment of the present application, an encapsulant of a photovoltaic module may include a layer including inorganic particles having a band gap energy of 3.3 eV or more, and a backsheet may include a layer including inorganic particles having a band gap energy of less than 3.3 eV. Alternatively, a product in which an encapsulant and a backsheet are integrated may be employed. FIG. 5 is a cross-sectional view of a photovoltaic module 3 employing an integrated sheet. Referring to FIG. 5, a layer 30 including inorganic particles A having a band gap energy of 3.3 eV or more is an encapsulant for encapsulating the photovoltaic module 3, and a layer 31 including inorganic particles B having a band gap energy of less than 3.3 eV is a backsheet. That is, it is the photovoltaic module 3 to which a product in which the encapsulant 30 and the backsheet 31 are integrated. The integrated product includes the encapsulant 30 including inorganic particles (A) having a band gap energy of 3.3 eV or more and the backsheet 31 including inorganic particles (B) having a band gap energy of less than 3.3 eV, which are sequentially formed from a side on which solar light is incident. The photovoltaic module 3 may include a transparent front substrate 34, an upper encapsulant 32 and a photovoltaic cell 35, which are sequentially stacked from a direction of incident solar light above the encapsulant 30 and the backsheet 31. Here, not shown in FIG. 5, the backsheet 31 for a photovoltaic cell may have a multilayer structure.

In one example, when the layer including inorganic particles having band gap energy of 3.3 eV or more and/or the layer including inorganic particles having band gap energy of less than 3.3 eV are used as encapsulants, each layer may have a thickness of 10 to 1000 μm, and particularly 20 to 600 μm. Since the reflectance with respect to UV rays may be dependent on an amount of particles per unit area, 20 g or more of inorganic particles having a band gap energy of 3.3 eV or more may be included per unit square meter, and when an amount of particles per volume is the same, the particle amount is proportional to the thickness of the layer. The thicknesses of the layer including inorganic particles having a band gap energy of 3.3 eV or more and the layer including inorganic particles having a band gap energy of less than 3.3 eV may be the same as or different from each other.

In addition, as described above, when the layer including inorganic particles having a band gap energy of 3.3 eV or more and the layer including inorganic particles having a band gap energy of less than 3.3 eV are used as a backsheet, each layer may have a thickness of 1 to 100 μm or 3 to 30 μm.

The encapsulant or backsheet of the photovoltaic module may further include at least one transparent layer as needed. The at least one transparent layer may be disposed above the layer including inorganic particles having a band gap energy of 3.3 eV or more, between the inorganic particles having a band gap energy of 3.3 eV or more and the inorganic particles having a band gap energy of less than 3.3 eV, or below the layer including inorganic particles having a band gap energy of less than 3.3 eV. Such a transparent layer preferably has a high transmittance with respect to the incident light.

In yet another embodiment, the layer including inorganic particles having a band gap energy of 3.3 eV or more may be directly stacked on the layer including inorganic particles having a band gap energy of less than 3.3 eV without a separate layer.

In one example, the encapsulant or backsheet of the photovoltaic module may have a structure further including a substrate. Here, the substrate may be disposed below the layer including inorganic particles having a band gap energy of less than 3.3 eV, and another layer including inorganic particles having a band gap energy of less than 3.3 eV may be further disposed below the substrate. As a result, the layer including inorganic particles having a band gap energy of less than 3.3 eV may be formed on both sides of the substrate.

A specific kind of the substrate is not particularly limited, and various materials known in the art may be used, and selected according to a required function, use, etc.

In one example, the substrate may be any one of all kinds of metals or polymer sheets. Here, as an example of the metal, aluminum or iron may be used, and as an example of the polymer sheet, a polyester-based sheet, a polyamide-based sheet, or a polyimide-based sheet may be used. Among these, the polyester-based sheet is generally used, but the present application is not limited thereto. As an example of the polyester-based sheet, a monolayer sheet, a stacked sheet, or a co-extrusion product of polyethylene terephthalate (PET), polyethylene naphthalate (PEN), or polybutylene terephthalate (PBT) may be used, but the present application is not limited thereto.

The substrate may have a thickness of approximately 50 to 500 μm, or 100 to 300 μm. By controlling the thickness of the substrate as described above, electric insulability, a moisture barrier property, a mechanical characteristic, and handleability of the backsheet may be excellently maintained. However, the thickness of the substrate is not limited within the above-described range, and may be suitably controlled as needed.

On the substrate, a high-frequency spark discharging treatment such as corona treatment or plasma treatment, thermal treatment, flame treatment, treatment with a coupling agent, treatment with an anchoring agent, or chemical activation using gaseous Lewis acid (e.g., $BF_3$), sulfonic acid, or high temperature sodium hydroxide may be performed.

In addition, in terms of further enhancing the moisture barrier property, an inorganic oxide such as silicon oxide or aluminum oxide may be deposited. In this case, to further enhance an adhesive strength, the above-described spark discharging treatment, flame treatment, treatment with a coupling agent, treatment with an anchoring agent, or chemical activation may be performed on the deposition-treated layer.

In addition, the backsheet for a photovoltaic cell may include a primer layer to enhance an adhesive property between the substrate and the layer including inorganic particles having a band gap energy of less than 3.3 eV. The primer layer is formed on the substrate, and ensures an adhesive strength between the substrate and the layer including inorganic particles having a band gap energy of less than 3.3 eV.

The primer layer may include an acrylic resin, a polyester-based resin, a urethane-based resin, a urea-based resin, an amide-based resin, an epoxy-based resin, an ether sulfone-based resin, an ether imine resin, or a silicon-based resin.

The primer layer may have a thickness of approximately 10 to 5,000 nm, or 50 to 2,000 nm, but may be suitably changed according to a desired adhesive property and the kind of a matrix resin of the layer including inorganic particles having a band gap energy of less than 3.3 eV.

In the encapsulant or backsheet of the photovoltaic module, at least one selected from the group consisting of an antioxidant, a photo stabilizer, a thermal stabilizer, and a UV stabilizer may be further included in at least one of the layer including inorganic particles having a band gap energy of 3.3 eV or more and the layer including inorganic particles having a band gap energy of less than 3.3 eV.

A structure of the photovoltaic module is not particularly limited as long as the multilayer film is included as an encapsulant for a photovoltaic cell or a backsheet for a photovoltaic cell, and thus various structures known in the art may be used.

The photovoltaic module may have various structures known in the art without particular limitation. Conventionally, the photovoltaic module may include a transparent front substrate, a backsheet, a photovoltaic cell encapsulated by an encapsulant between the front substrate and the backsheet, and the photovoltaic cell may be encapsulated by an upper encapsulant and the multilayer encapsulant. At least one photovoltaic cell may be included, and such photovoltaic cells may be aligned in series or parallel, thereby forming a photovoltaic cell array.

Here, as an active layer constituting the photovoltaic cell or photovoltaic cell array, representatively, a crystalline or amorphous silicon wafer, or a compound semiconductor such as CIGS or CTS may be used.

The encapsulant or backsheet for a photovoltaic cell including the multilayer film may be applied in various photovoltaic modules known in the art, including a module having the above-described active layer, and in this case, a method of constituting the module or the kinds of other materials are not particularly limited.

The present application will be described in further detail with reference to Examples according to the present application and Comparative Examples not according to the present application. However, the scope of the present application is not limited to the following Examples.

PREPARATION EXAMPLE 1

Manufacture of Master Batch

Master batches of barium sulfate and titanium dioxide were previously manufactured using a twin extruder (Mirco 27, Leistriz) with the composition shown in Table 1.

TABLE 1

|  | Composition | Content (wt %) |
|---|---|---|
| Mater batch (a) | Matrix resin | 95.15 |
|  | Coupling agent | 4.75 |
|  | Peroxide | 0.10 |
| Master batch (b) | Matrix resin | 79.88 |
|  | Barium sulfate | 20 |
|  | Titanium dioxide | — |
|  | Antioxidant 1 | 0.06 |
|  | Antioxidant 2 | 0.06 |
| Mater batch (c) | Matrix resin | 79.88 |
|  | Barium sulfate | — |
|  | Titanium dioxide | 20 |
|  | Antioxidant 1 | 0.06 |
|  | Antioxidant 2 | 0.06 |
| Master batch (d) | Matrix resin | 79.88 |
|  | Barium sulfate | 10 |
|  | Titanium dioxide | 10 |
|  | Antioxidant 1 | 0.06 |
|  | Antioxidant 2 | 0.06 |

*base resin: polyethylene elastomer (LG Chemical, co., Ltd., LC670)
*barium sulfate: Cotes, BSB-8000
*titanium dioxide: Dupont, TS6200
*coupling agent: vinyl trimethoxy silane, Korea Bio-Gen Co., Ltd.
*peroxide: 2,5-bis(t-butylperoxy)-2,5-dimethylhexane, Aldrich
*antioxidant 1: BASF, Irganox1076 (octadecyl 3,5-Di-(tert)-butyl-4-hydroxyhydrocinnamate)
*antioxidant 2: BASF, Irgafors 168 (tris(2,4-di-tert-butylphenyl) phosphite)

PREPARATION EXAMPLE 2

Preparation of Coating Solution A 65 g of a copolymer (VDF-CTFE copolymer) of vinylidene fluoride (VDF) and chlorotrifluoroethylene (CTFE), which had a crystallinity of 25% and a melting point of 165° C., 30 g of a copolymer (VDF-HFP copolymer) of VDF and hexafluoropropylene (HFP), which had a crystallinity of 24% and a melting point of 130° C., and 5 g of an acrylic polymer (the weight ratio of methyl methacrylate (MMA):glycidyl methacrylate (GMA):methyl methacrylic acid (MAA)=60:30:10) were melted in 431.3 g of N,N-dimethyl formamide (DMF), thereby preparing a first coating solution.

In addition, separate from the above, 0.420 g of a dispersant, BYK-111 (BYK) and 60 g of titanium dioxide (TiPure TS6200, Dupont) were added to 25 g of DMF, 50 g of zirconia beads each having a diameter of 0.3 mm were added again, the resulting mixture was stirred at a speed of 1,000 rpm for 1 hour, and the beads were completely removed, thereby preparing a millbase.

85.42 g of the prepared millbase was added to the first coating solution, and stirred again, thereby preparing a coating solution A.

PREPARATION EXAMPLE 3

Preparation of Coating Solution B 65 g of a VDF-CTFE copolymer of VDF and CTFE, which had a crystallinity of 25% and a melting point of 165° C., 30 g of a VDF-HFP copolymer of VDF and HFP, which had a crystallinity of 24% and a melting point of 130° C., and 5 g of an acrylic polymer (the weight ratio of MMA:GMA:MAA=60:30:10) were melted in 431.3 g of DMF, thereby preparing a first coating solution.

In addition, separate from the above, 0.420 g of a dispersant, BYK-111 (BYK) and 60 g of barium sulfate (BSB-8000, Cotes) were added to 25 g of DMF, 50 g of zirconia beads each having a diameter of 0.3 mm were added again, the resulting mixture was stirred at a speed of 1,000 rpm for 1 hour, and the beads were completely removed, thereby preparing a millbase.

85.42 g of the prepared millbase was added to the first coating solution, and stirred again, thereby preparing a coating solution B.

EXAMPLE 1

Preparation of Lower Encapsulant for Multilayer Photovoltaic Cell

To manufacture a layer including barium sulfate and a layer including titanium dioxide, 30 parts by weight of the mater batch (a) and 70 parts by weight of a master batch (b) including barium sulfate or a master batch (c) including titanium dioxide separately manufactured in Preparation Example 1 using a polyethylene elastomer (LG chem. Co., Ltd., LC670) were extruded using an extruder to which a T die having a width of 400 mm was attached and joined under a cooling roller, thereby preparing a lower encapsulant for a double-layered photovoltaic cell having a final thickness of 500 µm. Here, a T die temperature of the extruder was adjusted to be the same as 180° C. to extrude, and a thickness of each extrusion product extruded from the T die was controlled by changing a speed of the cooling roller.

EXAMPLE 2

Manufacture of Backsheet for Multilayer Photovoltaic Cell

The coating solution A previously prepared in Preparation Example 2 was coated was coated on a poly(ethylene terephthalate) (PET, thickness: 250 µm, Skyrol SG00L, SKC) film using an applicator by controlling a gap to have a thickness after drying of approximately 25 µm, and dried in an oven at 180° C. for approximately 2 minutes, thereby forming a layer including titanium dioxide. Afterward, coating was performed on the opposite side of the layer including titanium dioxide as described above, thereby forming a layer including titanium dioxide on both sides of the PET film.

Subsequently, the coating solution B previously prepared in Preparation Example 3 was coated on the upper layer of the layers including titanium dioxide using an applicator by controlling a gap to have a thickness after drying of approximately 25 µm and dried in an oven at 180° C. for approximately 2 minutes, thereby manufacturing a backsheet for a multilayer photovoltaic cell in which the layer including barium sulfate is formed.

EXAMPLE 3

Manufacture of Backsheet for Multilayer Photovoltaic Cell

The coating solution A previously prepared in Preparation Example 2 was coated on a poly(ethylene terephthalate) (PET, thickness: 250 µm, Skyrol SG00L, SKC) film using an applicator by controlling a gap to have a thickness after drying of approximately 25 µm, and dried in an oven at 180° C. for approximately 2 minutes, thereby forming a layer including titanium dioxide. Afterward, coating was performed on the opposite side of the layer including titanium dioxide as described above using the coating solution B previously prepared in Preparation Example 3, thereby manufacturing a backsheet for a multilayer photovoltaic cell in which the layer including barium sulfate and the layer including titanium dioxide are respectively formed above and below the PET film.

EXAMPLE 4

Manufacture of Integrated Encapsulation Product for Multilayer Photovoltaic Cell To manufacture an encapsulant layer including barium sulfate, a sheet was plasticized at 180° C. using a single extruder (RHOMEX 252, HAAHE) to which a T die having a width of 400 mm was attached by mixing 30 parts by weight of the master batch (a) and 70 parts by weight of the master batch (b) including barium sulfate separately manufactured in Preparation Example 1 using a polyethylene elastomer (LG chem. Co., Ltd., LC670) and stirred in a tumbler for 30 minutes or more. The sheet was manufactured to have a thickness of 500 µm by controlling a speed of a cooling roller for cooling an extrusion product extruded from a T die.

The manufactured barium sulfate sheet was laminated on a backsheet in which a fluorine-based resin including titanium dioxide was coated on both sides of the PET (thickness: 250 µm, Skyrol SG00L, SKC) substrate to have a thickness after drying of 25 µm at 150° C. for 10 minutes, thereby manufacturing an integrated encapsulation product for a multilayer photovoltaic cell having a total thickness of 800 µm.

COMPARATIVE EXAMPLE 1

To manufacture a monolayer sheet including barium sulfate, a sheet was plasticized at 180° C. using a single extruder (RHOMEX 252, HAAHE) to which a T die having a width of 400 mm was attached by mixing 30 parts by weight of the master batch (a) and 70 parts by weight of the master batch (b) including barium sulfate separately manufactured in Preparation Example 1 using a polyethylene elastomer (LG chem. Co., Ltd., LC670) and stirred in a tumbler for 30 minutes or more. The sheet was manufactured to have a thickness of 500 µm by controlling a speed of a cooling roller for cooling an extrusion product extruded from the T die.

COMPARATIVE EXAMPLE 2

A 500 µm-thick monolayer sheet including titanium dioxide was manufactured as described in Comparative Example 1, except that a titanium dioxide master batch was used instead of a barium sulfate master batch.

COMPARATIVE EXAMPLE 3

A lower encapsulant for a double-layered photovoltaic cell having a final thickness of 500 µm was manufactured as described in Example 1, except that a barium sulfate sheet was disposed under a titanium dioxide sheet.

COMPARATIVE EXAMPLE 4

To manufacture a monolayer sheet including barium sulfate and titanium dioxide, a sheet was plasticized at 180° C. using a single extruder (RHOMEX 252, HAAHE) to which a T die having a width of 400 mm was attached by mixing 30 parts by weight of the master batch (a) and 70 parts by weight of a master batch (d) including barium sulfate and titanium dioxide separately manufactured in Preparation Example 1 using a polyethylene elastomer (LG chem. Co., Ltd., LC670) and stirred in a tumbler for 30 minutes or more. The sheet was manufactured to have a thickness of 500 µm by controlling a speed of a cooling roller for cooling an extrusion product extruded from the T die.

EXPERIMENTAL EXAMPLE

Measurement of Reflectance

A sample was manufactured by cutting the sheets manufactured in Examples 1 to 4 and Comparative Examples 1 to 4 in a size of 70 mm×50 mm and laminating the cut sheets using a vacuum laminator (LM-30×30-S, NPC) at 150° C. for 10 minutes.

A reflectance of the laminated sample was measured using a UV-Vis-NIR spectrophotometer (UV-3600, SHIMADSU) in a wavelength range from 200 to 2500 nm. In Examples 1 to 4, a reflectance of the layer including barium sulfate of the laminated sample was measured in a direction of incident light, and in Comparative Example 3, a reflectance of the layer including titanium dioxide of the laminated sample was measured in a direction of incident light, and then the measurement results are shown in FIG. 6. Reflectance spectra of Example 1 and Comparative Examples 1 to 4 are shown in FIG. 6A, and reflectance spectra of Examples 2 to 4 are shown in FIG. 6B.

In addition, the measured reflectance spectra were divided into a UV region including a part of wavelengths of UV rays, for example, from 280 to 400 nm, and a visible region from 400 to 1200 nm, which were used in silicon photovoltaic cell, and an area of each region was calculated to compare reflectances, and then the measurement results are shown in FIG. 7. The reflectances of Example 1 and Comparative Examples 1 to 4 are shown in FIG. 7A, and the reflectances of Examples 2 to 4 are shown in FIG. 7B.

As shown in FIGS. 6 and 7, it can be confirmed that the multilayer encapsulant, multilayer backsheet, or integrated product (Examples 1 to 4) having the barium sulfate encapsulant layer in the direction of incident light has a remarkably higher reflectance in the UV region than those of the titanium dioxide encapsulant monolayer sheet (Comparative Example 2), the multilayer sheet (Comparative Example 3) having the titanium dioxide encapsulant layer in a direction of incident light, and the monolayer sheet (Comparative Example 4) simultaneously including titanium dioxide and barium sulfate.

In addition, it can be confirmed that the barium sulfate encapsulant monolayer sheet (Comparative Example 1) has a high reflectance in the UV region, but has low reflectances in the visible and IR regions.

According to exemplary embodiments of the present application, a multilayer film including inorganic particles having a band gap energy of 3.3 eV or more and inorganic particles having a band gap energy of less than 3.3 eV in different layers, in which the layer including inorganic particles having a band gap energy of 3.3 eV or more is disposed at an upper portion than the layer including inorganic particles having a band gap energy of less than 3.3 eV toward incident light, that is, based on incident light, is provided, and thus reflectance with respect to a UV region, as well as visible and IR regions, may be increased. Accordingly, the incident light in the UV region may be reflected by the inorganic particles having a band gap energy of 3.3 eV or more to be internally reflected again on a front part of the photovoltaic module, thereby enhancing energy conversion efficiency.

While the invention has been shown and described with reference to certain exemplary embodiments thereof, it will be understood by those skilled in the art that various changes in form and details may be made therein without departing from the scope of the invention as defined by the appended claims.

What is claimed is:

1. A photovoltaic module, comprising:
a photovoltaic cell; and
a multilayer film disposed below the photovoltaic cell,
wherein the multilayer film comprises a first layer disposed below the photovoltaic cell and including a first matrix resin and first inorganic particles having a band gap energy of 3.3 eV or more; and a second layer disposed below the first layer and including a second matrix resin and second inorganic particles having a band gap energy of less than 3.3 eV,
wherein the only inorganic particles present in the first layer are the first inorganic particles, and the only inorganic particles present in the second layer are the second inorganic particles,
wherein the first layer is disposed closer to incident light than the second layer,
wherein the first layer is directly stacked on the second layer,
wherein the multilayer film has a reflectance of 20.4% or more with respect to UV rays in a wavelength range of 280 to 400 nm, and a reflectance of more than 80% with respect to visible rays in a wavelength range of 400 to 1200 nm,
wherein the first inorganic particles are barium sulfate ($BaSO_4$) and the second inorganic particles are titanium dioxide ($TiO_2$),
wherein the first layer includes the first inorganic particles in an amount of 10 to 200 parts by weight with respect to 100 parts by weight of the first matrix resin, and the second layer includes the second inorganic particles in an amount of 10 to 200 parts by weight with respect to 100 parts by weight of the second matrix resin, and
wherein each of the first matrix resin and the second matrix resin is a mixture consisting of a copolymer of vinylidene fluoride and chlorotrifluoroethylene, a copolymer of vinylidene fluoride and hexafluoropropylene, and an acrylic polymer of methyl methacrylate, glycidyl methacrylate and methyl methacrylic acid.

2. The module according to claim 1, wherein a reflectance of the first layer with respect to UV rays is higher than that of the second layer with respect to UV rays.

3. The module according to claim 1, wherein both the first layer and the second layer constitute a backsheet.

4. The module according to claim 1, further comprising a substrate disposed below the second layer.

5. The module according to claim 4, wherein the second layer is also disposed below the substrate, such that the second layer is formed on both sides of the substrate.

6. The module according to claim 4, wherein the substrate is a monolayer sheet, a stacked sheet, or a co-extrusion product of aluminum, iron, polyethylene terephthalate (PET), polyethylene naphthalate (PEN), or polybutylene terephthalate (PBT).

7. The module according to claim 4, wherein at least one surface treatment selected from treatments with plasma, corona, a primer, an anchoring agent, and a coupling agent, and thermal treatment is performed on at least one surface of the substrate.

8. The module according to claim 1, further comprising:
a transparent front substrate; and
an upper encapsulant,
wherein the photovoltaic cell is encapsulated by the upper encapsulant and the multilayer film.

* * * * *